United States Patent [19]
Arita

[11] 3,985,591
[45] Oct. 12, 1976

[54] METHOD OF MANUFACTURING PARALLEL GATE MATRIX CIRCUITS

[75] Inventor: Shigeru Arita, Ibaragi, Japan

[73] Assignee: Matsushita Electronics Corporation, Osaka, Japan

[22] Filed: Mar. 21, 1975

[21] Appl. No.: 560,735

Related U.S. Application Data

[63] Continuation-in-part of Ser. No. 340,253, March 13, 1973, abandoned.

[30] Foreign Application Priority Data

Mar. 14, 1972   Japan.................. 47-26255

[52] U.S. Cl................... 148/187; 29/571; 29/577; 29/578; 357/23; 357/41; 357/45
[51] Int. Cl.²............ H01L 21/22; H01L 27/10
[58] Field of Search.......... 148/187; 29/571, 577, 29/578; 357/23, 41, 45

[56] References Cited
UNITED STATES PATENTS

| | | | |
|---|---|---|---|
| 3,519,504 | 7/1970 | Cuomo | 148/187 |
| 3,541,543 | 11/1970 | Crawford et al. | 357/45 X |
| 3,608,189 | 9/1971 | Gray | 29/571 |
| 3,702,985 | 11/1972 | Proebsting | 357/45 X |
| 3,739,238 | 6/1973 | Hara | 357/41 X |
| 3,740,732 | 6/1973 | Frandon | 357/23 X |

OTHER PUBLICATIONS

Dennard et al., "Metal–Oxide–Semiconductor . . . Array . . . " I.B.M. Tech. Discl. Bull., vol. 10, No. 1, June 1967, pp. 77–78.
Landauer, R. W., "IGFET Decoders and Encoders" I.B.M. Tech. Discl. Bull., vol. 10, No. 1, June 1967, pp. 81–82.
"MOS Moves Onto High–Speed Track" Electronics, May 26, 1969, pp. 49–50.
Brown et al., "Self–Registered Molybdenum–Gate MOSFET" J. Electrochem. Soc., vol. 115, No. 8, Aug. 1968, pp. 874–876.

*Primary Examiner*—L. Dewayne Rutledge
*Assistant Examiner*—W. G. Saba
*Attorney, Agent, or Firm*—Stevens, Davis, Miller & Mosher

[57] ABSTRACT

A method of making a metal oxide semiconductor large scale integration circuit incorporating both parallel and series gate matrix circuits using a self-alignment technique is provided, wherein a plurality of diffused regions of a conductivity type opposite to that of a silicon substrate are formed in the silicon substrate to extend substantially parallel to one another, a silicon dioxide layer as a field oxide layer is formed over the entire surface area of this structure, a hole is cut into the dioxide layer at each of selected portions thereof lying between the diffused regions, a gate oxide layer is formed in each of the holes, and then a plurality of gate electrode layers are strip shaped and located transverse to the diffused regions with each of the gate oxide layers having at least a portion of the associated gate electrode layer placed thereon, thereby providing a plurality of MOS field-effect transistors. This method makes it possible to produce parallel gate matrix circuits by the use of a diffusing mask for self-alignment as a mask pattern for forming the gate oxide layer.

1 Claim, 10 Drawing Figures

3,985,591

METHOD OF MANUFACTURING PARALLEL GATE MATRIX CIRCUITS

CROSS-REFERENCE TO RELATED APPLICATIONS

This application is a continuation-in-part of application Ser. No. 340,253 filed on Mar. 13, 1973, now abandoned.

BACKGROUND OF THE INVENTION

1. Field of the Invention

The present invention relates to a method for fabricating a parallel gate matrix circuit in a self-alignment type metal oxide semiconductor large scale integration circuit (hereinafter referred to as MOS LSI).

2. Description of the Prior Art

In the MOS LSI, in order to reduce a parasitic capacitance in the circuit to improve a frequency characteristic thereof, a method for manufacturing transistors by a so-called self-alignment technique has been frequently used.

FIG. 1 of the accompanying drawings is a sectional view of an MOS field-effect transistor fabricated in a silicon substrate by a conventional self-alignment technique, and the MOS field-effect transistor comprises a gate section consisting of a gate oxide layer 2 formed on a silicon substrate 1 having a type of conductivity and a gate electrode layer 3 formed on the gate oxide layer 2, and a drain region 4 and a source region 5 each having a type of conductivity opposite to that of the silicon substrate.

In the figure, numeral 6 designates a silicon dioxide layer formed during the diffusion processing of the drain and source regions, which constitutes a field oxide layer as usually known. With the self-alignment technique, it has been customary to use a material, e.g., polycrystalline silicon or molybdenum for the gate electrode layers so that the gate section consisting of this gate electrode layer and the gate oxide layer formed thereunder serves as a mask during the diffusion of the drain and source regions.

In an MOS field-effect transistor fabricated in this manner, there is practically no drain and source regions formed in overlapping relation directly under the gate section and thus this type of MOS field-effect transistor has a reduced effective capacitance per unit area of gate and an improved frequency characteristic.

FIGS. 2a and 2b illustrate an enlarged portion of a large scale integration circuit fabricated by utilizing the self-alignment technique described above, with FIG. 2a showing a plan view of the enlarged portion and FIG. 2b showing a sectional view taken along the line A — A of FIG. 2a.

In FIG. 2a, numerals 7, 8, 9 and 10 designate gate electrode layers consisting of molybdenum, for example, and diffused regions (hatched portions) having a type of conductivity opposite to that of the silicon substrate are formed on both sides of the respective gate electrode layers. In the construction shown in FIG. 2a, the diffused regions are indicated by numerals 11 through 15. Thus, MOS field-effect transistor is provided by each gate electrode layer portion having the diffused regions formed on both sides thereof as shown at 16 in the figure.

FIG. 2b is a sectional view taken along the line A — A of FIG. 2a to more clearly show the structure of the fabricated MOS field-effect transistor and, as will be seen from this figure, each of the diffused regions provides a drain region and a source region for different ones of the MOS field effect transistors. Numerals 17 through 20 designate the gate oxide layers.

The application of this self-alignment technique results in the fabrication in a silicon substrate of a plurality of MOS field-effect transistor groups each thereof having their gate electrodes connected in common.

Consequently, if it is desired to produce a matrix circuit by utilizing the MOS field-effect transistors fabricated in a silicon substrate in this way, the resultant matrix circuit must take the form of a series gate circuit.

In short, a drawback of the prior art self-alignment fabrication method is that it is impossible to manufacture parallel gate type matrix circuits.

SUMMARY OF THE INVENTION

The present invention intends to overcome that above difficulties and inconveniences.

Therefore, the object of the present invention is to provide a method for fabricating a parallel gate matrix circuit in a self-alignment type MOS LSI circuit array without requiring any special mask while allowing the use of a diffusing mask for self-alignment as a mask pattern for forming a gate oxide film.

A novel feature of the method according to the present invention is that the fabrication of parallel gate matrix circuits which has heretofore been impossible with only the conventional self-alignment fabrication method is made possible and moreover the frequency characteristic of parallel gate matrix circuits obtainable by this method is comparable in every respects with that of circuits obtainable by the conventional self-alignment fabrication method. Thus, the method according to the present invention is a very great advantage in the fabrication of matrix circuits in large scale integration circuits.

Other objects, features and advantages of the present invention will become apparent from the description of the following preferred embodiment when taken in conjunction with the accompanying drawings.

DESCRIPTION OF THE PREFERRED EMBODIMENT

The method for manufacturing the parallel gate matrix circuit in accordance with the present invention will now be described with reference to the accompanying drawings.

Figure 1:
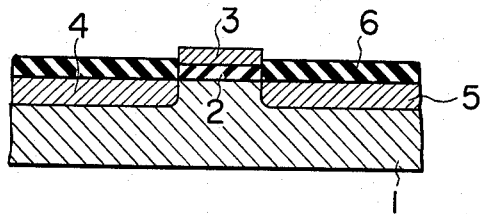
FIG. 1 is sectional view showing an MOS field-effect transistor fabricated by a conventional self-alignment technique.
Figure 2A:
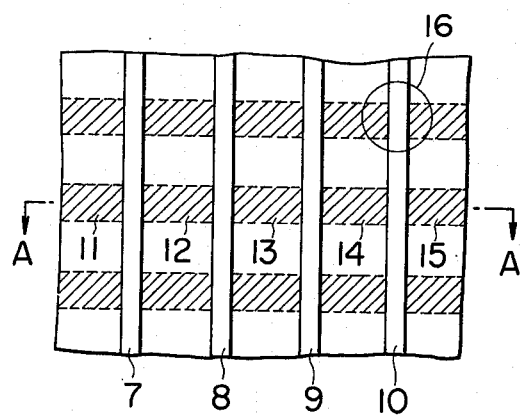
FIGS. 2a and 2b illustrate respectively a plan view and sectional view of an enlarged portion of a large scale integration circuit fabricated by the conventional self-alignment technique.
Figure 2B:
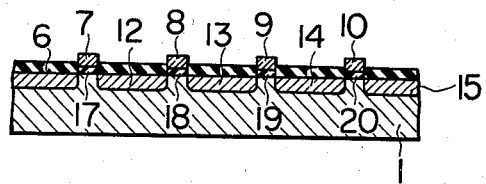
Figure 3A:
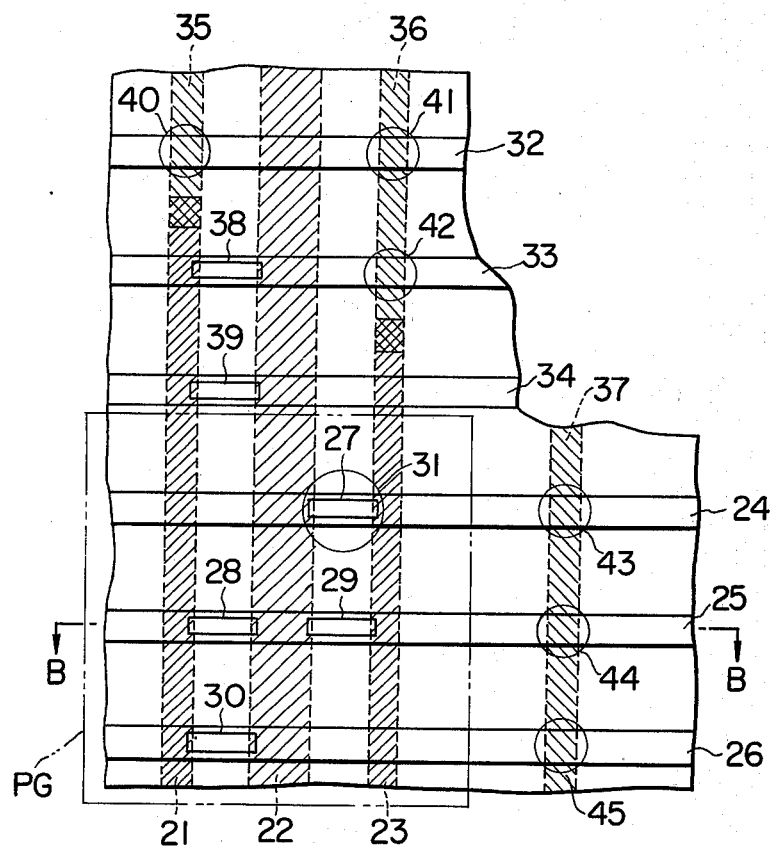
FIGS. 3a and 3b illustrate respectively a plan view and sectional view of an enlarged portion of a parallel gate matrix circuit fabricated by a method according to the present invention.
Figure 3B:
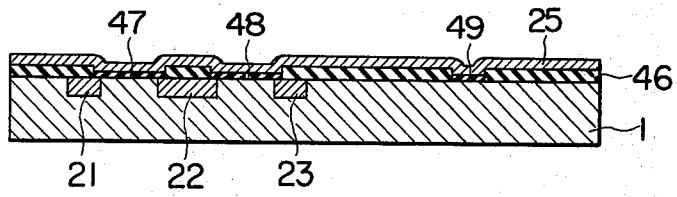

FIGS. 3a and 3b show a fragmentary sectional view in an enlarged scale and plan view, respectively, of an MOS LSI including a parallel gate matrix circuit formed in accordance with the method of the present invention. In the drawings, reference numerals 21 to 23 designate diffused regions of opposite conductivity type to that of a silicon substrate 1 which have been preformed in the silicon substrate 1, 24, 25 and 26 designate gate electrode layers formed in transverse relation to the diffused regions 21 to 23, 27 to 30 designate regions which function as gates of MOS field-effect transistors constituting the parallel gate matrix circuit PG. For example, at region 31 an MOS field-effect transistor is formed. Reference numerals 32, 33 and 34 designate other gate electrode layers, hatched areas 35, 36 and 37 designate impurity doped regions for forming self-alignment transistor, 38 and 39 designates regions which function as gates of MOS transistors of non-self-alignment type, like 27 to 30, and 40 to 45 designate MOS field-effect transistors formed by the self-alignment technique.

FIG. 3b shows a sectional view taken along the line B — B of FIG. 3a to more clearly illustrate the construction of the MOS field-effect transistors forming the parallel gate matrix circuit in accordance with the present invention. As shown therein, gate oxide films 47, 48 and 49 are formed in openings formed by partially removing a silicon oxide film 46 constituting a field oxide film which covers the entire surface of the silicon substrate 1 in which the diffused regions 21, 22 and 23 are formed. On the gate oxide films 47, 48 and 49 a gate electrode layer 25 is overlaid. At the region where the gate oxide film 49 is arranged, the self-alignment type MOS field-effect transistor 44 is formed through a subsequent diffusion process. In the present method, the diffusing mask for self-alignment can also be used as a mask pattern for forming those regions 27 to 30 and 38, 39 which function as the gates of the non-self-alignment type MOS field-effect transistors. That is, all processes other than the process for performing the diffused regions 21, 22 and 23 can be in common with the process relating to the self-alignment.

FIGS. 4a to 4e illustrate the fabrication steps of this MOS field-effect transistor and the structure shown in FIG. 3 is obtained through the following fabrication steps.

Figure 4A:
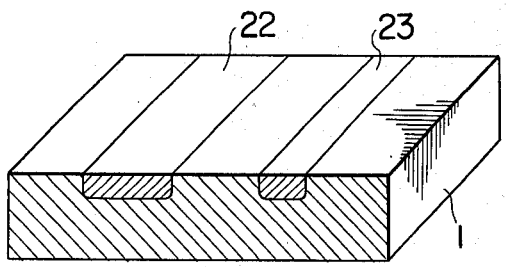
FIGS. 4a to 4e illustrate the fabrication steps of a MOS field-effect transistor for a parallel gate matrix circuit according to the method of the present invention.
Figure 4B:
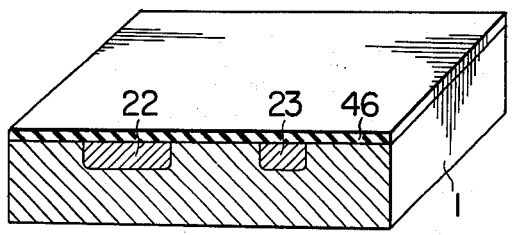

The diffused regions 22 and 23, for example, having a type of conductivity opposite to that of the silicon substrate 1 are first formed in the silicon substrate 1 to extend substantially parallel to each other (FIG. 4a). In the course of this diffusion process, the silicon dioxide layer 46 (field oxide layer) is formed over the entire surface area of the silicon substrate as shown in FIG. 4b.

Figure 4C:
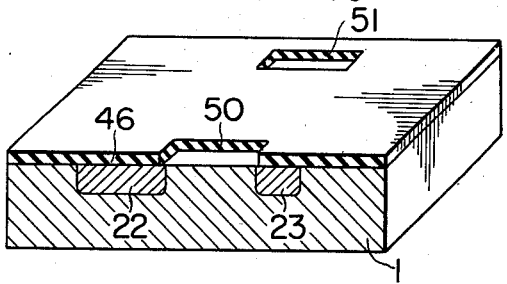
Figure 4D:
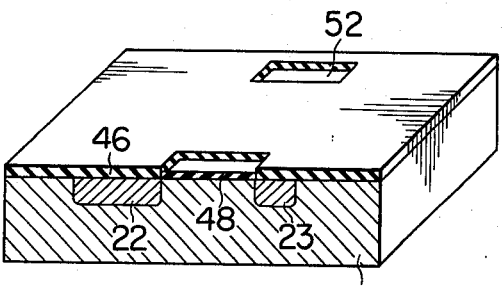

Thereafter, the silicon dioxide layer covering the silicon substrate is removed at selected portions thereof between the diffused regions 22 and 23 to form openings or holes 50 and 51 as shown in FIG. 4c. The holes can be formed at the same time with the formation of diffusing windows using a diffusion mask for self-alignment.

The holes formed in the silicon dioxide layer determine the positions where MOS field-effect transistors are to be provided and hence the construction of a matrix circuit, and therefore it is important that the holes are cut in consideration of a matrix circuit to be fabricated into the silicon substrate.

Figure 4E:
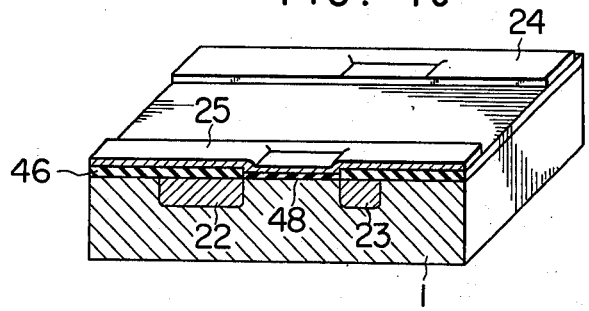

After the formation of the holes 50 and 51, gate oxide layers 48 and 52 are formed respectively in the holes 50 and 51 (FIG. 4d) and then the gate electrode layers 24 and 25 are formed as shown in FIG. 4e. In this way, MOS field-effect transistors may be provided only at desired portions of the silicon substrate.

While, in the method of this invention so far described, the diffused regions preliminarily formed in the silicon substrate have been utilized as the drain and source regions, as shown in FIG. 4e, in the MOS field-effect transistor thus obtained practically there is no drain and source regions formed in overlapping relation directly under the gate section and thus this type of MOS field-effect transistor has reduced effective capacitance per unit area of gate as in the MOS field-effect transistors fabricated by the conventional self-alignment technique. In other word, the MOS field-effect transistor fabricated in accordance with the method of this invention has an improved frequency characteristic.

Furthermore, since the fabrication of MOS field-effect transistors according to the method of this invention is substantially dependent on the formation of gate sections and since the formation of gate sections is effected selectively, any desired parallel gate matrix circuit may be fabricated simultaneously with the fabrication of MOS field effect transistors depending on the selection of positions where gate sections are to be formed.

From the above-mentioned description it should be appreciated that the present method involves taking the steps shown in FIGS. 4a to 4c in order to form parallel gate MOS transistors and then fabricating series gate matrix circuits by the self-alignment method using the extended polysilicon or molybdenum layers 24, 25 and 26 as shown in the drawings and the mask oxide layer 46 used for formation of the gate oxide film in the parallel gate MOS transistors by non-self-alignment technique is also used as the diffusing mask for fabricating the series MOS transistors by the self-alignment technique.

I claim:
1. A method for fabricating a parallel gate matrix circuit in a self-alignment type metal oxide semiconductor large scale integration circuit, said parallel gate matrix circuit including a silicon substrate, a plurality of diffused regions of opposite conductivity-type to that of the silicon substrate and a plurality of gate electrode layers arranged transversely to said diffused regions to form metal oxide semiconductor field-effect transistors at crosspoints thereof, said method comprising the steps of forming said plurality of diffused regions extending in parallel to each other; covering the entire area of the silicon substrate surface in which said diffused regions are fabricated with a field oxide film; then forming openings at required portions of the area of said field oxide film between said diffused regions simultaneously with the formation of diffusing windows using a diffusion mask for self-alignment; forming a gate oxide film in said openings; and thereafter forming a polycrystalline silicon or molybdenum gate electrode layer in transverse relation with said extended diffused regions, at least a portion of said gate electrode layer lying on said gate oxide film, whereby metal oxide semiconductor field-effect transistors are formed in only those areas where said gate oxide film is formed.

* * * * *